(12) United States Patent
Theus et al.

(10) Patent No.: US 7,138,874 B2
(45) Date of Patent: Nov. 21, 2006

(54) TWO-STAGE AMPLIFIER

(75) Inventors: Ulrich Theus, Gundelfingen (DE); Juergen Kessel, Freiburg (DE)

(73) Assignee: MICRONAS GmbH, Freiburg (DE)

( * ) Notice: Subject to any disclaimer, the term of this patent is extended or adjusted under 35 U.S.C. 154(b) by 0 days.

(21) Appl. No.: 10/649,321

(22) Filed: Aug. 26, 2003

(65) Prior Publication Data
US 2004/0113687 A1 Jun. 17, 2004

(30) Foreign Application Priority Data
May 13, 2000 (DE) ............................... 100 23 524

(51) Int. Cl.
*H03F 3/04* (2006.01)
(52) U.S. Cl. ...................... 330/310; 330/141
(58) Field of Classification Search ................ 330/141, 330/150, 281, 302, 310; 327/148, 157, 536
See application file for complete search history.

(56) References Cited

U.S. PATENT DOCUMENTS

| | | | |
|---|---|---|---|
| 5,477,186 A | 12/1995 | Kobatake | ................ 330/9 |
| 5,539,351 A | 7/1996 | Gilsdorf et al. | ............ 327/379 |
| 5,745,002 A | 4/1998 | Baschirotto et al. | ........ 327/554 |
| 6,259,316 B1 | 7/2001 | Nagaraj | ........................ 330/9 |

FOREIGN PATENT DOCUMENTS

EP            0 688 096         12/1995        ....................... 1/2

OTHER PUBLICATIONS

Pierre Favrat et al., "A High-Efficiency CMOS Voltage Doubler," *IEEE Journal of Solid-State Circuits*, vol. 33, No. 3, Mar. 1998, pp. 410-416.
Gerrit W. den Besten et al., "Embedded 5 V-to-3.3 V Voltage Regulator for Supplying Digital IC's in 3.3 V CMOS Technology," *IEEE Journal of Solid-State Circuits*, vol. 33, No. 7, Jul. 1998, pp. 956-962.
European Search Report.

*Primary Examiner*—Khanh Van Nguyen
(74) *Attorney, Agent, or Firm*—O'Shea, Getz & Kosakowski, P.C

(57) ABSTRACT

A two-stage amplifier includes a first stage and a second stage that are DC-connected through a coupling capacitor Cp. A charge pump generates a bias voltage Vp that is applied across the coupling capacitor Cp leads to maintain the time average of the voltage across said coupling capacitor constant.

19 Claims, 2 Drawing Sheets

TWO-STAGE AMPLIFIER

BACKGROUND OF THE INVENTION

The invention relates to the field of amplifier circuits, and in particular to a two-stage amplifier that can amplify both AC and DC voltage signals.

Many digital integrated circuits have been fabricated in CMOS technology with 5-volt supply voltage. This has led to a large number of systems with a 5-volt supply on the printed circuit boards. However, as CMOS technology has developed the maximum allowable supply voltage of the digital IC's has dropped to 3.3-volts for 0.5 μm and 0.35 μm technologies. In addition, it is expected that this voltage will be further reduced as newer technologies are developed. Since IC manufacturers want to use modern CMOS processes for cost reduction, a supply voltage compatibility problem results.

The publication entitled "*Embedded* 5 V to 3.3 V Voltage Regulator for Supplying Digital IC's in 3.3 V CMOS Technology", IEEE *Journal of Solid-State Circuits*, Volume 33, No. 7, July 1998, Page 956–962, discloses a fully integrated voltage supply in which a 5-volt supply voltage is reduced to 3.3 volts on the chip. The lower supply voltage of 3.3 volts is used to supply a CMOS digital circuit designed for lower current consumption. In an embodiment of the voltage supply, the gate connection of an n-channel output transistor is controlled by a comparator via a charge pump to create the required activation voltage. The comparator and the n-channel output transistor, which is connected as a source follower, form a two-stage amplifier with an inverting and a non-inverting input. The charge pump is a voltage doubler whose input variable is the output voltage of the comparator. Because the prevailing load on the amplifier output is not known for stability reasons, the fed-back voltage is tapped from a simulator directly from the amplifier output. A linear regulator is not used to control the voltage doubler and thus to control the amplifier, but the fed-back voltage is merely tested, in the manner of a two-point control, whether it is greater or smaller than a specified comparison value. Depending on the difference, the charge pump increases or decreases the gate voltage of the n-channel output transistor. This arrangement is not very well suited for general amplification purposes.

Therefore, there is a need for an improved two-stage amplifier that is suited for reduced supply voltages.

SUMMARY OF THE INVENTION

Briefly, according to an aspect of the invention, a two-stage amplifier includes a first stage and a second stage that are DC-connected through a coupling capacitor Cp. The first and second amplifier stages are DC isolated from one another by the coupling capacitor. A charge pump generates a bias voltage Vp that is applied across the coupling capacitor Cp. The charge pump is connected to the coupling capacitor and applies an essentially constant and floating voltage to the coupling capacitor.

Even if the first amplifier stage is a transconductance amplifier, since the output current of the first stage is effectively transferred via the coupling capacitor to the MOS input of the second amplifier stage. This applies both to DC and AC signals, as long as their frequency is less than the pump frequency. As a result, the two-stage amplifier may amplify signals with DC and AC components.

The charge pump generates a floating voltage at its outputs, in fixed proportion to a supplied reference voltage. If the first stage is a transconductance amplifier, the input of the second amplifier stage represents a dominant pole. For stability purposes, especially in the case of amplification with feedback, this dominant pole can be enlarged by a compensation capacitor. To assure DC isolation of the coupling capacitor from the charge pump, the output current paths are split by pump capacitors in an arrangement that is insensitive to stray capacitances. As a result, current can not flow through these pump capacitors from the first or second amplifier stage to ground, or to the supply connection. This allows the charge pump to operate as a voltage source as free from ground as possible. The remaining stray capacitances of the coupling capacitor and of the two pump capacitors are toward ground, and thus parallel to the compensation capacitor whose action as a pole is enhanced. The current to charge or discharge the parasitic capacitances does not need to be furnished from the first stage, but is provided by the charge pump. As a result, the current lost by the remaining stray capacitances does not result in an offset voltage at the input of the first stage.

The size of the coupling capacitor depends on the maximum output current of the first stage and the cycling rate of the charge pump. As a rule of thumb, the maximum output current of the first stage can be taken up by the coupling capacitor for the duration of a half cycle of the charge pump, without the first stage leaving the permitted output voltage range. On the other hand the coupling capacitor should be smaller than the capacitor that forms the dominant pole at the input of the second stage. If these two considerations are no longer compatible, then the cycling frequency of the charge pump must be increased.

Charge pumps for increasing the voltage in CMOS technology are described extensively, for example, in the IEEE Journal of Solid-State Circuits, Volume 33, No. 3, March 1998, Pages 410–416, in the paper "*A High-Efficiency CMOS Voltage Doubler*". Such circuits require a non-overlapping two-phase cycle, which increases the supply reference voltage through two pump capacitors, electronic switches, or non-linear elements. The non-overlapping two-phase cycle is generally formed in a pump generator from a supply clock signal with a pulse-pause ratio of 1:1.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
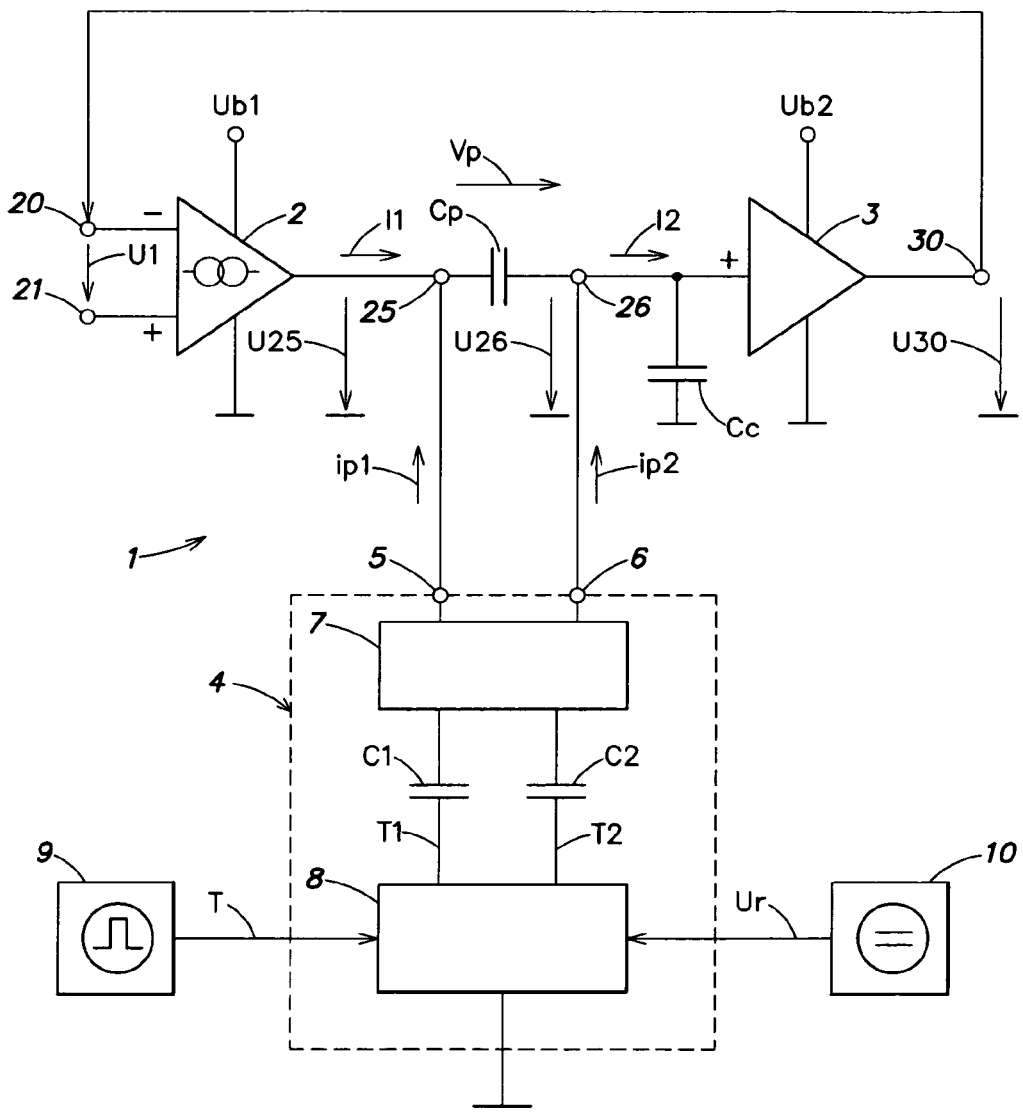
FIG. 1 is a block diagram illustration of a two-stage amplifier that includes a charge pump.

FIG. 1 is a block diagram illustration of a two-stage amplifier 1. The amplifier 1 includes first and second amplifier stages 2, 3, which are connected in series through a coupling capacitor Cp. A first terminal 25 of the coupling capacitor is connected to the output of the first stage 2, and a second terminal 26 of the capacitor Cp is connected to the input of the second stage 3. The first stage 2 is preferably a transconductance amplifier with a difference input. An inverting input 20 of the first stage 2 serves, for example, as the input for the output signal U30, which is tapped from the output 30 of the second stage 3. A non-inverting input 21 of the first stage 2 serves as the signal input. The first and second stages 2, 3 have a common supply voltage or two separate supply voltages Ub1 and Ub2. In the latter case, the second supply voltage Ub2 is generally less than the first supply voltage Ub1.

As a transconductance amplifier, the first stage 2 converts the difference voltage U1 existing between the inputs 20, 21 into an output current I1. For the further discussion, it is initially assumed that the coupling capacitor Cp is short-circuited so the output current I1 directly reaches the single non-inverting input of the second stage 3. The second stage 3 is configured as a voltage amplifier having a high-ohm input. The gate capacitances of the input transistors represent a capacitive load for the output current I1, preferably in combination with an additional compensation capacitor Cc. For stability reasons, this should form the dominant pole of the control loop with the two-stage amplifier 1. The current I1 flows from the first stage 2 and recharges the capacitive input of the second stage 3, until the input difference voltage U1 has become zero through the fed-back output voltage U30. When this point has been reached, the output current I1 has also become zero.

According to an aspect of the invention, the amplifying function of the first and second stages 2,3 continues with the coupling capacitor Cp, even if the output voltage range of the first stage 2 no longer or only partially matches the required input voltage range of the second stage 3. The input voltage range of the second stage 3 may even partly lie outside the supply voltage Ub1 of the first stage 2. In combination with a charge pump 4, the coupling capacitor Cp enables the required voltage shift between the output of the first stage 2 and the input of the second stage 3. The charge pump 4 maintains the time average of the voltage across the coupling capacitor Cp constant. The instantaneous voltage across the coupling capacitor Cp depends on the signal U1. Through its first and second outputs 5, 6, the charge pump 4 forces a bias voltage Vp that is applied as a floating voltage across the terminals 25, 26 of the coupling capacitor Cp. A reference voltage Ur from an integrated reference voltage source 10 is used to form the bias voltage Vp. The charge pump 4 is controlled by a clock pulse T, which is conducted to the two-stage amplifier 1 from either the outside (i.e., off-chip) or from a clock pulse generator 9 that is integrated on the same chip.

The charge pump 4 generates first and second pump currents ip1, ip2 at the first and second outputs 5, 6, respectively. The first pump current ip1 is superposed on the output current I1 and determines the output voltage U25 of the first stage 2. The input capacitance of the second stage 3 and the compensation capacitor Cc connected in parallel are charged or discharged through a charge/discharge current I2. When the two-stage amplifier 1 is in a steady state, the currents I1 and I2 are zero. The input voltage of the second stage 3, and thus the voltage U26 at the second terminal 26 of the coupling capacitor Cp, depends on the sum of the input current I2 and the second pump current ip2. The two pump currents ip1, ip2 are adjusted according to a voltage step-up ratio of the charge pump 4, in such a way that the time average of the specified bias voltage Vp remains constant.

How the charge pump 4 generates the constant, floating bias voltage Vp will be described in terms of the embodiment illustrated in FIG. 2. A rectangular clock pulse T is input to the pump generator 8. This pulse preferably has a pulse-pause ratio of 1:1. The clock pulse T controls a first inverter 35 and a second inverter 36 arranged in series, which provide a first pump clock pulse T1 and a second pump clock pulse T2, respectively. CMOS inverters may be used for the inverters 35, 36, since then the modulation of the two pump clock pulses T1, T2 spans the voltage difference between the voltage supply of the inverters and the ground connection. The voltage supply is the regulated reference voltage Ur from the reference voltage source 10 (FIG. 1). For other applications, it is contemplated that the voltage supply of the two inverters 35, 36 is not coupled to the separate reference voltage supply 10, but to the signal voltage U1. The pump clock pulses T1, T2 actuate first and second pump capacitors C1, C2 via associated terminals a1, a2, whose opposite terminals a3, a4 are each connected to an input of an electronic switching device 7. Depending on the phase of the clock pulse T, and thus on the phase of the pump clock pulses T1, T2, the current paths of the pump currents ip1, ip2 are switched to the two terminal contacts 25, 26 of the connected coupling capacitor Cp. The first and second terminal contacts 25, 26 are charged or discharged through the two pump clock pulses T1, T2 inasmuch as the bias voltage Vp differs from the specified value.

The current paths in the switching device 7 are actuated at the same time by electronic switches. In one phase, they are shown by dashed lines in FIG. 2, and in the other phase by dash-dot lines. For example, the current path between the terminals a3, 25 (shown by dashes) is actuated when the pump clock pulse T1 is in its upper switching level, and the current path between the terminals a4, 26 (shown by dots and dashes) is actuated when the pump clock pulse T2 is in its lower switching level (e.g., ground). The opposite is obtained during the other phase of the pump clock pulses T1, T2. Through this control, a higher potential is set at the terminal 25 than at the terminal 26, whose potential is less by the bias voltage Vp. The pump currents ip1, ip2, required to adjust the charge are relatively small. As a result, the required current flow time is short, so that they appear only during the front and rear edge of the clock pulse, essentially independent of the duration and period of the pump clock pulses T1, T2.

Nonlinear elements may also open and close the respective current paths, as is customary with charge pumps, rather than using electronic switches in the switching device 7. This is symbolized in FIG. 2 by diodes D1, D2, D3, D4. If the voltage at the connected pump capacitor C1, C2 exceeds the forward voltage of the respective diode, the diode becomes conducting, and a pump current ip1, ip2 flows. The difference from the pumped potential is reduced through the charge or discharge at the connected coupling capacitor terminal 25, 26, so that the forward voltage is no longer exceeded. This terminates the pump process for the particular clock pulse phase. During the other clock pulse phase, the diode is nonconducting so current cannot flow in the wrong direction.

Figure 2:
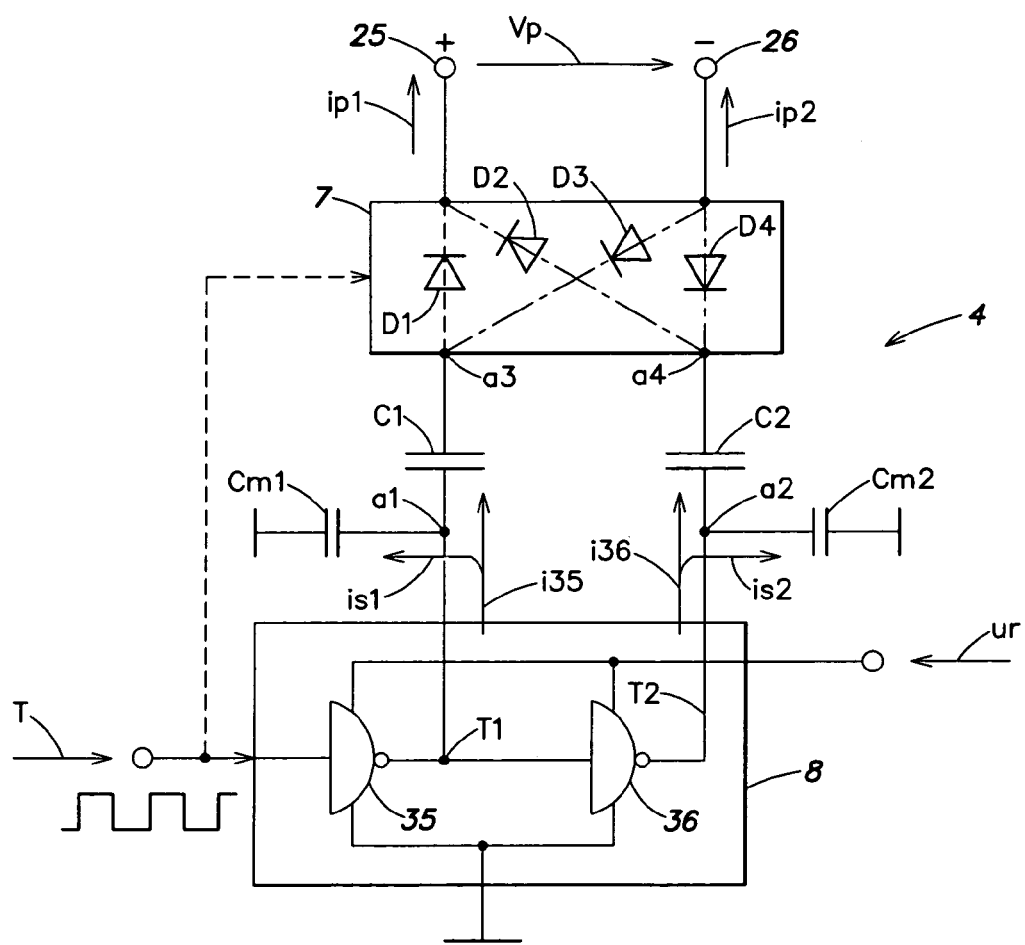
FIG. 2 is a schematic illustration of a charge pump embodiment.

Referring to FIG. 2, the currents is1, is2 for charging or discharging the parasitic capacitances Cm1, Cm2 do not come from the first stage 2 through the terminal 25, but rather from the pump generator 8. The charge and discharge over the entire voltage excursion Ur, which is usual for pump circuits, takes place only at the parasitic capacitances Cm1, Cm2. In contrast, the voltages across the pump capacitors C1, C2 and the coupling capacitor Cp are essentially constant or at most are changed only slightly. As already mentioned, direct current can not flow through the terminals 25, 26 to ground. The charge and discharge current for the parasitic capacitances Cm1, Cm2 is furnished through a branched-off portion is1, is2, respectively, of the original pump currents i35, i36, which, in the final analysis, are fed from the reference voltage 10 via the supply voltage of the inverters 25, 26. The other portions of the original pump currents i35, i36 form the first or second pump currents ip1, ip2 at the output of the charge pump 4.

The function of the charge pump creates a noise frequency in the amplified signal at the output of the two-stage amplifier 1. The noise frequency is twice the clock pulse rate of the clock pulse T. By specifying the clock pulse rate in a frequency range outside the signal frequencies, the noise frequency can then easily be suppressed by a low pass filter.

Although the present invention has been shown and described with respect to several preferred embodiments thereof, various changes, omissions and additions to the form and detail thereof, may be made therein, without departing from the spirit and scope of the invention.

What is claimed is:

1. A two-stage amplifier that provides a two-stage amplifier output signal, the two-stage amplifier comprising:
    a first amplifier stage that receives a first amplifier input signal, and provides a first amplifier output signal;
    a second amplifier stage that includes a second amplifier input lead, and provides the two-stage amplifier output signal;
    a coupling capacitor having a first lead and a second lead, where the first lead receives the first amplifier output signal and the second lead is connected to the second amplifier input lead such that the coupling capacitor is connected in series between the first and second amplifier stages; and
    means for generating a bias voltage that is applied to the coupling capacitor to maintain the voltage across the coupling capacitor constant, where
    the two-stage amplifier output signal is fedback and coupled to an input signal to provide the first amplifier input signal.

2. The two-stage amplifier of claim 1, further comprising an integrated voltage source that provides a reference voltage to the means for generating.

3. The two-stage amplifier of claim 2, where the means for generating provides the bias voltage to maintain a fixed ratio between the reference voltage and the first amplifier input signal.

4. The two-stage amplifier of 1, where the first amplifier stage includes a transconductance amplifier.

5. The two-stage amplifier of claim 4, further comprising a compensation capacitor that is connected electrically parallel to the input of the second amplifier stage.

6. The two-stage amplifier of claim 4, where the means for generating a bias voltage comprises:
    a pump generator that is responsive to a reference signal and a clock signal, and provides a first clock pulse on a first pump generator output lead and a second pump clock pulse on a second pump generator output lead;
    a first capacitor having a third lead and a fourth lead, where the third lead is connected to the first pump generator output lead;
    a second capacitor having a fifth lead and a sixth lead, where the fifth lead is connected to the second pump generator output lead; and
    a switching element that is coupled to the fourth lead and the sixth lead and provides a first pump current to the first lead and a second pump current to the second lead.

7. The two-stage amplifier of claim 5, where the value of the coupling capacitor is less than the value of the compensation capacitor.

8. A two-stage amplifier that provides a two-stage amplifier output signal, the two-stage amplifier comprising:
    a first amplifier stage that receives a first amplifier input signal, and provides a first amplifier output signal;
    a second amplifier stage that includes a second amplifier input, and provides the two-stage amplifier output signal;
    a coupling capacitor having a first lead and a second lead, where the first lead receives the first amplifier output signal and the second lead is connected to the second amplifier input lead such that the coupling capacitor is connected in series between the first and second amplifier stages;
    a charge pump that generates a bias voltage that is applied to the coupling capacitor to maintain the time average of the voltage across the coupling capacitor constant; and
    a voltage source that provides a reference voltage to the charge pump,
    where the charge pump includes means for generating a bias voltage to maintain a fixed ratio between the reference voltage and the first amplifier input signal.

9. The two-stage amplifier of claim 8, further comprising a compensation capacitor that is connected electrically parallel to the input of the second amplifier stage.

10. The two-stage amplifier of claim 8, where the two-stage amplifier output signal is fedback and coupled to an input signal to provide the first amplifier input signal.

11. The two-stage amplifier of claim 9, where the value of the coupling capacitor is less than the value of the compensation capacitor.

12. A two-stage amplifier that provides a two-stage amplifier output signal, the two-stage amplifier comprising:
    a first amplifier stage that receives a first amplifier input signal, and provides a first amplifier output signal;
    a second amplifier stage that includes a second amplifier input lead, and provides the two-stage amplifier output signal;
    a coupling capacitor having a first lead and a second lead, where the first lead receives the first amplifier output signal and the second lead is connected to the second amplifier input lead such that the coupling capacitor is connected in series between the first and second amplifier stages; and
    a charge pump coupled to the first and second leads of the coupling capacitor to maintain the time average of the voltage across the coupling capacitor constant.

13. The two-stage amplifier of 12, further comprising a compensation capacitor that is connected electrically in parallel to the input of the second amplifier stage.

14. The two-stage amplifier of claim 12, where the charge pump comprises:
    a pump generator that is responsive to a reference signal and a clock signal, and provides a first clock pulse on a first pump generator output lead and a second pump clock pulse on a second pump generator output lead;
    a first capacitor having a third lead and a fourth lead, where the third lead is connected to the pump generator output lead;
    a second capacitor having a fifth lead and a sixth lead, where the fifth lead is connected to the second pump generator output lead; and
    a switching element that is coupled to the fourth lead and the sixth lead and provides a first pump current to the first lead and a second pump current to the second lead.

15. The two-stage amplifier of claim 13, where the value of the coupling capacitor is less than the value of the compensation capacitor.

16. The two-stage amplifier of claim 12, further comprising an integrated voltage source that provides a reference voltage to the charge pump.

17. The two-stage amplifier of claim 12, where the charge pump includes means for generating a bias voltage to maintain a fixed ratio between the reference voltage and the first amplifier input signal.

18. The two-stage amplifier of claim 12, where the two-stage amplifier output signal is fedback and coupled to an input signal to provide the said first amplifier input signal.

19. The two-stage amplifier of claim 18, where current flows from the first amplifier stage, until the value of the input signal is equal to zero.

* * * * *

UNITED STATES PATENT AND TRADEMARK OFFICE
CERTIFICATE OF CORRECTION

| | |
|---|---|
| PATENT NO. | : 7,138,874 B2 |
| APPLICATION NO. | : 10/649321 |
| DATED | : November 21, 2006 |
| INVENTOR(S) | : Theus et al. |

It is certified that error appears in the above-identified patent and that said Letters Patent is hereby corrected as shown below:

Column 5
In claim 1, line 25, delete "signal" and insert --signal,--

Column 6
In claim 8, line 9, delete "signal" and insert --signal,--
In the claims, claim 12, line 42, delete "signal" and insert --signal,--

Column 8
In claim 18, line 3, before "first" delete "said"

Signed and Sealed this

Twenty-third Day of January, 2007

JON W. DUDAS
*Director of the United States Patent and Trademark Office*